(12) United States Patent
Gabara

(10) Patent No.: US 6,573,760 B1
(45) Date of Patent: Jun. 3, 2003

(54) RECEIVER FOR COMMON MODE DATA SIGNALS CARRIED ON A DIFFERENTIAL INTERFACE

(75) Inventor: Thaddeus J. Gabara, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/221,263

(22) Filed: Dec. 28, 1998

(51) Int. Cl.$^7$ .................................................. H03K 5/22
(52) U.S. Cl. .......................... 327/65; 327/89; 327/359; 327/563; 330/253; 330/258
(58) Field of Search .............................. 327/50, 63, 65, 327/77, 89, 355, 359, 560–563; 330/252, 253, 258, 277; 375/220, 257; 326/126, 127

(56) References Cited

U.S. PATENT DOCUMENTS

| | | | |
|---|---|---|---|
| 4,546,275 A | * 10/1985 | Pena-Finol et al. | 327/355 |
| 4,947,406 A | 8/1990 | Yokoyama | 375/220 |
| 5,166,956 A | 11/1992 | Baltus et al. | 375/286 |
| 5,648,743 A | * 7/1997 | Nagaya et al. | 330/252 |
| 5,650,743 A | * 7/1997 | Bien et al. | 327/359 |
| 5,945,848 A | * 8/1999 | Ali | 326/127 |
| 6,157,693 A | * 12/2000 | Jayaraman | 377/47 |

OTHER PUBLICATIONS

Bell Telephone Laboratories, "Transmission Systems for Communications", vol. 1., pp. 3–20–3–41 (1959).
Bell Telephone Laboratories, "Transmission Systems for Communication", Revised 4$^{th}$ Ed., Chp. 2 (Prior to 1982).
R.B. Blackman, "Fundamental Circuit Theory", Sec. 6.7, pp. 6–24–6–31 (1955).

* cited by examiner

*Primary Examiner*—Minh Nguyen
(74) *Attorney, Agent, or Firm*—John Ligon

(57) ABSTRACT

A circuit for extracting a common mode data signal applied to a plurality of component signals. The circuit including a current driver, resistance, and a common mode extraction unit connected in series. The extraction unit has an impedance substantially proportional to the average voltage of the applied input signals and may be formed of a series of matched transistors connected in parallel. In a single-path configuration, when pairs of differential signals are applied, the voltage drop across the extraction unit is proportional to the overall common mode signal level carried by the differential signal components. In a multiple path configuration, two or more extraction units may be connected to a common current driver and configured in a differential amplifier configuration.

12 Claims, 4 Drawing Sheets

RECEIVER FOR COMMON MODE DATA SIGNALS CARRIED ON A DIFFERENTIAL INTERFACE

FIELD OF THE INVENTION

This invention is related to a circuit for receiving data signals from an interface. More particularly, this invention is related to a circuit for extracting data which is transmitted using common-mode signals injected onto a differential data interface.

BACKGROUND OF THE INVENTION

Differential signaling, in which two wires are used to transmit a differential data signal, is commonly used to transmit data in noisy environments where single-ended data signaling, using only one wire per data signal, cannot provide a sufficient degree of noise immunity. Environments of this type are particularly common in high performance systems which have reduced signaling levels to increase frequency.

In differential signaling, data is transmitted as the difference of the voltage or current on two differential signal components. When noise is present on the interface, the signal levels on the two differential signal components are affected substantially the same amount, and therefore the difference between the two signals remains unchanged. A significant drawback to this type of signaling, however, is that two wires are necessary to transmit each data signal. This is a particularly serious problem when providing communication between integrated circuits because the input and output wires physically limit the connectivity to the chip.

One newly discovered method to increase the amount of digital data carried on a differential interface is to utilize the common mode level of the differential signal as an additional data carrier. This method is described in a related U.S. patent application, entitled "Method and System of Data Transmission Using Differential and Common Mode Data Signaling," filed on the same day as the present application. According to the new technique, a first data signal is transmitted as differential signal components over a differential interfaces, such as a balanced pair of wires. A second data signal is transmitted by varying the common mode signal level carried by the differential signal pair. The common mode signal is injected in a manner which affects each component of the differential pair equally, thus preserving the difference between the two signals, and thereby the differentially transmitted data.

Several differential pairs may be used. For example, a first common mode signal may be injected into one differential pair and a second common mode signal may be injected onto a second differential pair. The two injected common mode signals are used to transmit differential signal components of a third data signal. Yet a fourth common mode data signal can be transmitted by raising or lowering the two common mode signals in a manner which does not affect the differentially transmitted, common-mode carried third data signal. In an alternative embodiment, one differential pair is used to send a differential signal and a common mode signal and a third wire is used to send a signal which is differentially varied with respect to the transmitted common mode signal to thereby transmit the common-mode data in a differential manner. In this alternative embodiment, two "differential" signals are sent over three wires.

To extract data transmitted in this manner, it is necessary to determine both the differentially transmitted data signal and the common mode signal level. When a data signal is sent as a pair of differentially varied common mode signals, it is also necessary to extract the differentially transmitted data from the appropriate common mode signals. It is advantageous to be able to extract this type of data signal in a single circuit, instead of extracting each common mode signal individually, and then processing the extracted signals as conventionally transmitted differential signals.

In addition, it is advantageous to extract the common mode data signal without drawing a noticeable amount of current from the differential interface. This is particularly useful, for example, when the combined differential and common mode data transmitters and receivers are configured in a bus configuration having several receivers connected to the same data interface. Drawing current would affect the differential and common mode data levels and require the output drivers to source additional current for each receiver on the interface.

SUMMARY OF THE INVENTION

According to the invention, a common mode receiver circuit is provided which extracts a common mode data signal injected onto a differential interface. The differential signal components are applied to a common mode extraction unit with an impedance that is a function of the common mode signal carried on the signal components, but which is substantially independent of the specific differential signal values. By measuring the impedance, in the form of current flow or a voltage drop, the value of the common mode data signal can be extracted. In the preferred embodiment, the common mode extraction unit comprises two sets of substantially matched transistors, where each set has substantially the same overall operating characteristics. In the particular case where the transistors from each set have the same length, the sum of the device widths in each set is substantially equal. Each set is connected in parallel to a common current source and sink, where each transistor of the set is biased by an applied differential signal component.

In a second embodiment of the invention, a receiver circuit is provided to extract a differential data signal having differential signal components transmitted as common mode signals carried over a differential interface. The circuit includes two common mode extraction units connected in parallel to a common current source or sink in the form of a hybrid differential-style amplifier. The two differential components from the first differential interface are applied to the first unit and the two components from the second differential interface are applied to the second unit. According to the invention, each amplifier leg carries a current proportional to the common mode signal level on the respective differential pair, even as the magnitude of the applied differential signal components vary. Because the total current carried by the two legs is fixed, the magnitude of current carried by one leg indicates the value of a data signal differentially transmitted over the common mode signals.

BRIEF DESCRIPTION OF THE DRAWINGS

The foregoing and other features of the present invention will be more readily apparent from the following detailed description of the drawings of illustrative embodiments of the invention in which:

FIG. 2 is a graph illustrating a common mode data signal carried by differential signal components and the common mode signal as extracted by the receiver of FIG. 1a;

DETAILED DESCRIPTION OF THE PREFERRED EMBODIMENTS

Figure 1A:
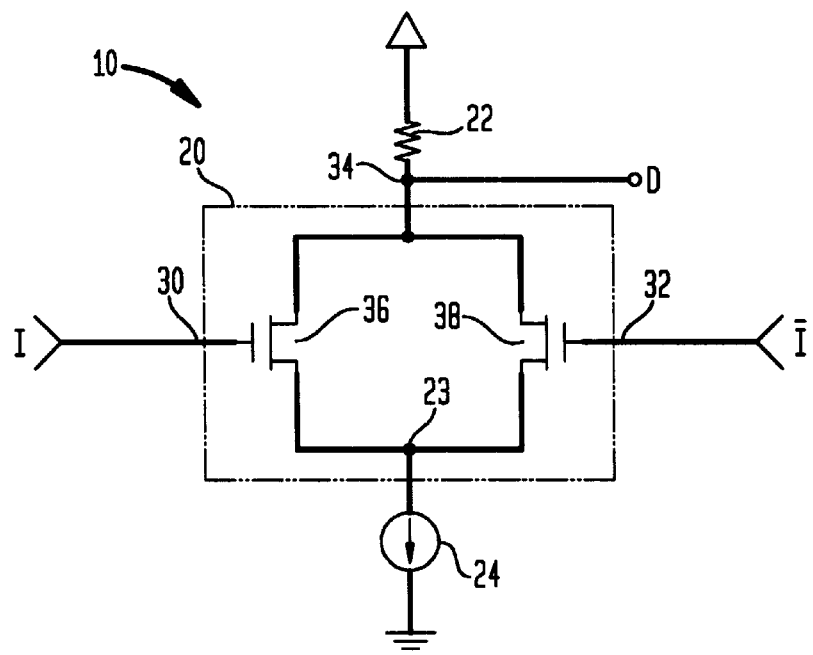
FIGS. 1a and 1b are circuit diagrams of a common mode receiver according to the present invention.

Turning to FIG. 1a, there is shown a circuit diagram of a common mode receiver according to the present invention. Receiver 10 comprises a common mode extraction unit 20 which is connected between nodes 34 and 23 and arranged in series with a resistance 22 connected between a reference voltage (i.e., power supply) and node 34. Node 23 may be connected to another reference voltage (i.e., ground) by means of a current driver 24. As used herein, a current driver may be an individual current source or a current sink, or a combination of the two, such as a matched current source-sink pair. The resistance may be a passive impedance formed, for example, from polysilicon, or an active device, such as a transistor. The positioning of the resistance 22 and current driver 24 relative to the extraction unit 20 is dependant on the specific technology and input voltage levels utilized.

Extraction unit 20 has at least two data inputs 30, 32, which generally are differential signal components I, Ī, and has an impedance with a magnitude depending on the applied common mode voltage. The magnitude of the impedance is substantially independent of the differential relationship between the applied signals. As used specifically herein, a common mode voltage is defined as the average voltage two or more data signal components. A common mode current is similarly defined.

The impedance R for extraction unit 20 may be represented as R≈f(I+Ī). It can be appreciated that in the course of changing the data value being transmitted, the magnitudes of the differential signal components are varied inversely with respect to each other. Thus, the common mode signal level, and therefore the impedance of unit 20, remains constant.

According to the new data transmission method, data is transmitted over the differential interface by varying the common mode voltage level. The common mode transmitted data values can be extracted by applying the differential signal components to inputs 30, 32 of extraction unit 20 and measuring the resulting impedance, as indicated, for example, as the voltage drop across series-connected resistance 22 at node 34 when extraction unit 20 is configured with a resistor to form a voltage divider network.

In the preferred embodiment, the common mode extraction unit 20 comprises a pair of substantially matched transistors 36, 38 connected in parallel between nodes 34 and 23 as shown. Each transistor is driven by an applied differential signal component 30, 32. MOS transistors can be used to eliminate DC current drain on the differential interface. Although a small amount of gate capacitance is added to the interface, it is negligible when compared to the capacitance inherent in the interface itself. Other devices may also be used, for example as bipolar transistors, although these devices will introduce a small current drain through the inputs.

Furthermore, while resistance 22 is depicted in the figures as provided by a resistor, the resistance can be provided by various other devices or load elements. Preferably, resistance 22 and, if provided, current driver 24 are comprised of MOS transistors with appropriate biasing voltages. Various MOS transistor configurations for these devices are known to those skilled in the art. For example, resistance 22 may be comprised of a MOS transistor, wherein the applied gate voltage is used to select the proper resistance level. Similarly, current driver 24 may be a suitable MOS transistor, where the total amount of current flow is determined by the device size and applied gate voltage. Advantageously, an all-transistor, and preferably, all-MOS configuration may easily be formed as part of an integrated circuit. Variations in device structure resulting from non-idealities during fabrication as well as temperature and power supply conditions can be compensated for using appropriate feedback techniques to adjust device biasing voltages.

Figure 1B:
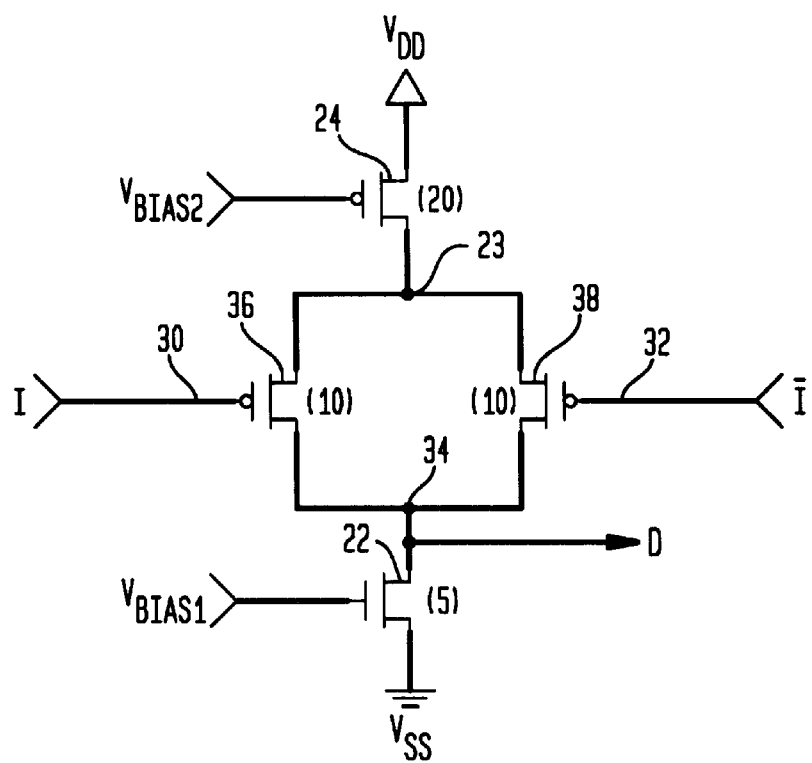

A particular CMOS implementation of common mode receiver 10' for extracting a common mode signal from a balanced pair of inputs where the common mode signal level is close to $V_{SS}$ is illustrated in FIG. 1b. The preferred relative channel widths for the devices is shown in parentheses. The resistance 22 is formed with an NMOS transistor having a relative width of 5 and receiving a driving voltage $V_{BIAS1}$. The common mode extraction unit 20 includes two PMOS transistors 36, 38 connected in parallel and each having relative channel widths of 10. The current source 24 is provided by a PMOS transistor wherein the current is controlled by applied driving voltage $V_{BIAS2}$. The extracted common mode output level can be taken as the voltage at node 34.

Figure 2:
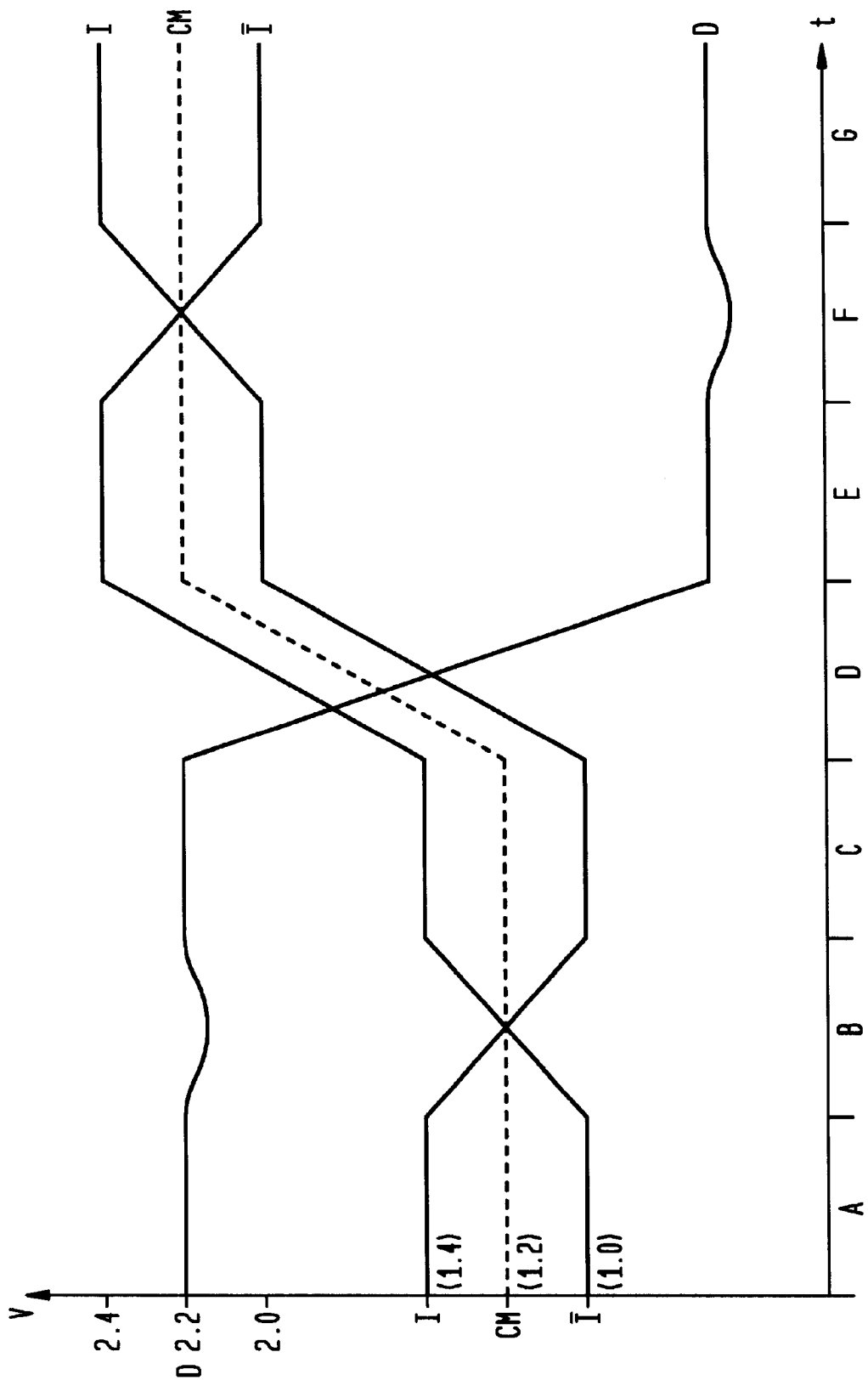

The operation of common mode receiver 10 and the circuit of FIG. 1a will now be discussed with reference to a specific example. Turning to FIG. 2, there is shown a graph illustrating a common mode data signal CM carried by a pair of differential signal components I, Ī, and an extracted common mode data signal D output by the circuit of FIG. 1a. The differential data signal is represented as the difference in magnitude between the two differential signal components. The value of the common mode data signal is represented by the magnitude of the common mode level for the differential signals.

Either a differential current or voltage data signaling method may be utilized. In a differential voltage signaling system, the signal components I and Ī may directly represent the applied signal levels. The data values are transmitted directly, i.e., by selectively connecting each signal component to one of two different voltage sources. In a differential current signaling system, the interface is terminated with resistance. The direction of current flow through the interface indicates the data value and is controlled by a current switch. In a current signaling system, the illustrated signal components in FIG. 2 represent the voltage drop across the load resistance. It can be appreciated that these signal levels may be sampled by the receiver 10 at any point on the interface, i.e., as part of a receiving circuit, or as part of a circuit monitoring data on the interface at a point separate from the input or output circuits.

During time A, differential signal component I is at a first predefined voltage and signal component Ī is at a second, lower, predefined voltage. This state represents a differential transmission of a first binary value. During time B, the differentially transmitted data value is changed to a second binary value by switching the differential relationship between the signal components I and Ī. The changed state is represented during time C. As shown, the common mode signal level CM remains constant during times A, B, and C and represents a first common mode data value.

Because transistors 36 and 38 are substantially matched, the current flow through extraction unit 20 during times A and C is substantially the same. During the transition time B, the current flow remains substantially constant, even as the applied gate voltages 30, 32 are changing, as shown in the graph. Although there may be some variation as a result of changes in the bias point for the transistors, the amount of variation during this period can be minimized by selecting component values and bias points such that transistors 36, 38 operate in a substantially linear mode. However, even moderate non-linearities are tolerable, provided that the net output variations are relatively small compared to the overall common mode voltage levels.

During time D, the common mode signal is increased to a new magnitude, achieved in time period E, which indicates a second common mode data value. As shown, both differential signal components I, Ī are increased as well. The difference between the differential signal components, and therefore the differentially transmitted data value, remains unchanged. However, because the gate voltages applied to transistors 36, 38 is increased, the impedance of extraction unit 20 decreased (in the case of n-channel transistors), causing the output voltage D from node 34 to drop. Therefore, output 34 from receiver 10 represents the common mode data carried over the differential interface, here in inverted form. During time F, the differential data components are switched back to the first data state, achieved during time G. As in the transition during time B, the extracted common mode data value D is substantially constant.

Although the circuit of FIG. 1a and the example discussed with respect to FIG. 2 illustrates extraction of a common mode signal carried by one pair of differential signal components, the circuit 10 may be modified and used to extract a common mode signal applied across a number of signal components. In this configuration, several transistors are connected in parallel, each one of which receives a component signal as a biasing input. If three such transistors are used, the output will reflect the common mode signal level as carried by the three input signals. Similarly, as discussed in more detail with respect to FIG. 4, below, four transistors may be connected in parallel, receiving input from two pairs of differential signal components. Other permutations are also possible.

Figure 3A:
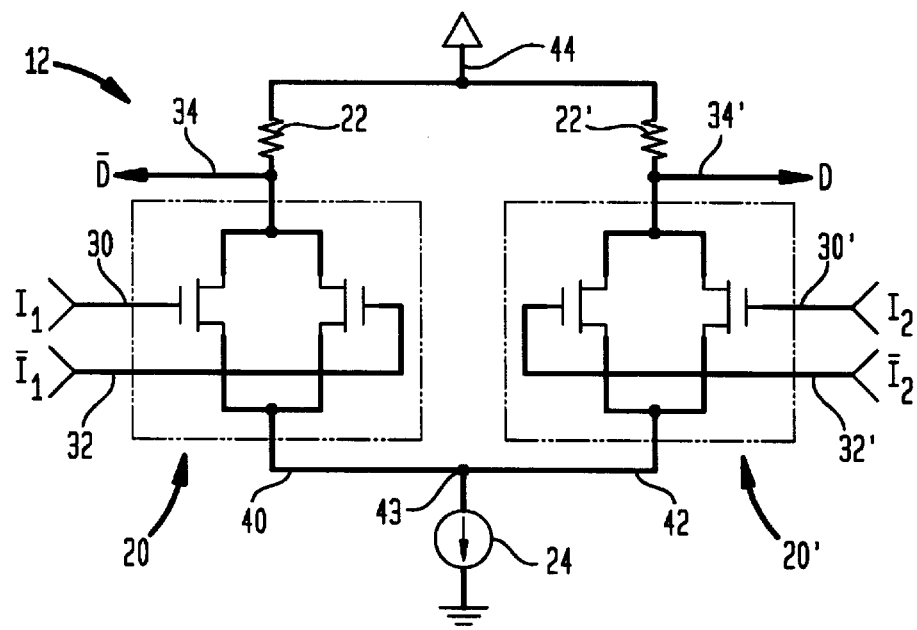
FIGS. 3a and 3b are circuit diagrams of a common mode receiver according to a second embodiment of the invention.
Figure 3B:
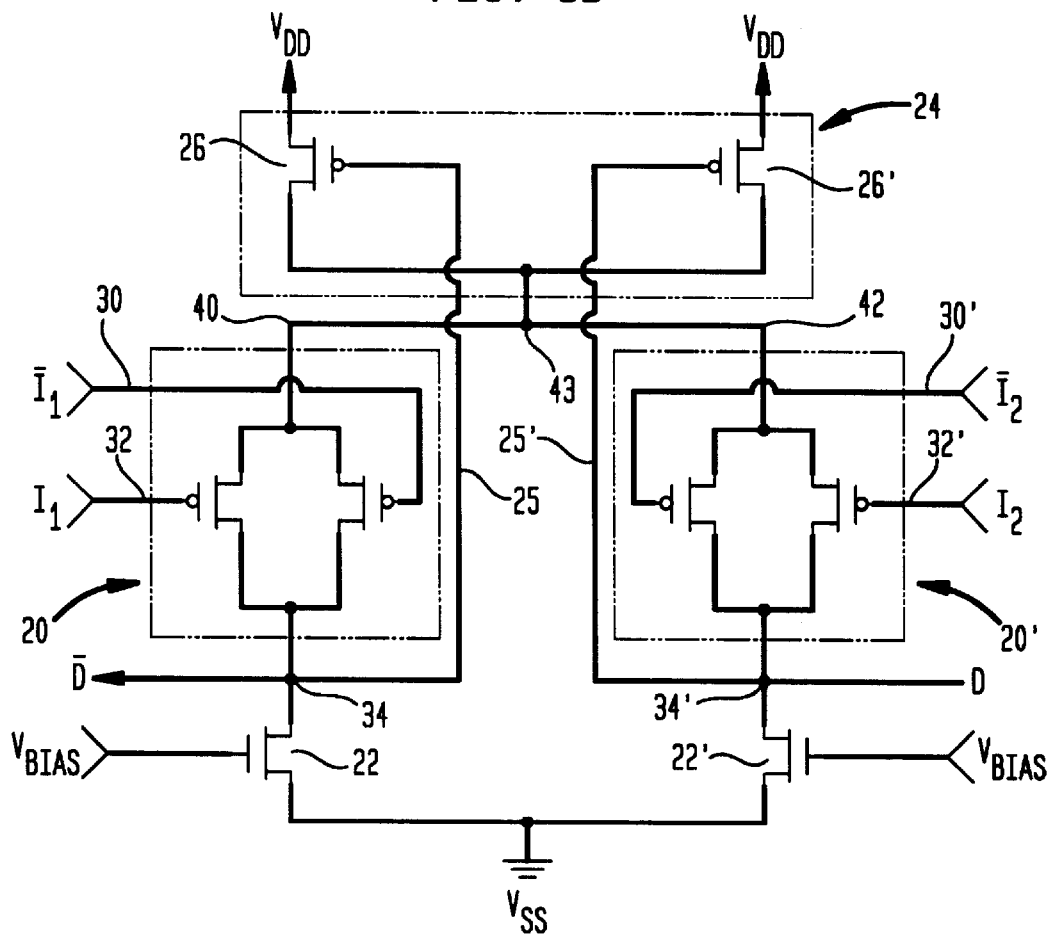
Figure 3C:
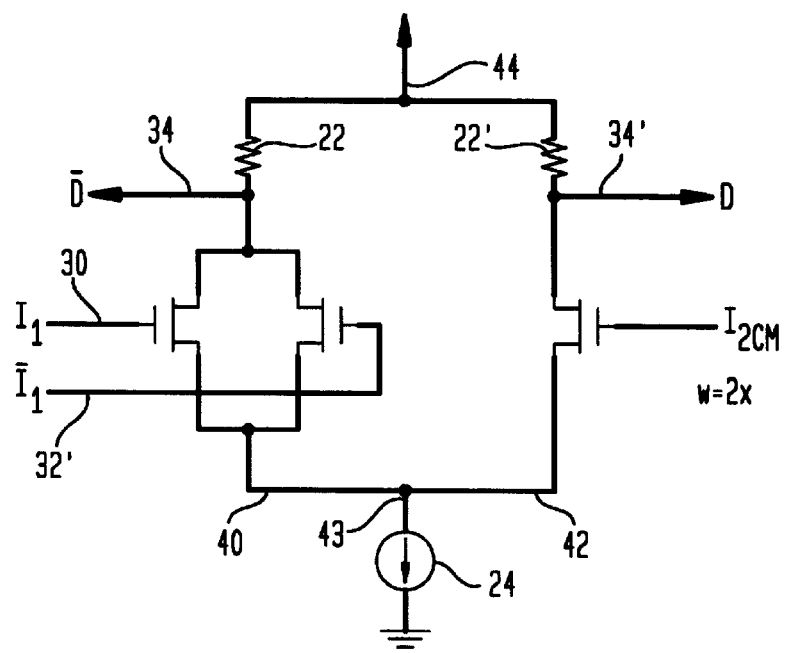
FIG. 3(c) is an illustration of a common mode receiver according to another embodiment of the invention.

Turning to FIG. 3a or FIG. 3c, there is shown a circuit diagram of a common mode receiver 12 according to a second embodiment of the invention. Several extraction units 20, here implemented using N-channel transistors, are combined in a differential amplifier arrangement and used to extract a data signal that is differentially transmitted using common mode data signals as the differential signal components. A first common mode data signal CM1 is carried by differential interface signal components $I_1, \bar{I}_1$ and a second, complementary, common mode data signal CM2 is carried by differential signal components $I_2, \bar{I}_2$.

The receiver 12 has two current carrying legs 40, 42 connected in parallel between node 44, which may be connected to a reference voltage such as power supply, and common current driver 24 at node 43, here shown as a current sink connected to ground. Each leg 40, 42 comprises a series connected extraction unit 20, 20' for extracting a common mode signal from the applied differential signal components and a resistance 22, 22'. Differential interface signal components $I_1$ and $\bar{I}_1$ are applied to the two inputs 30, 32 of extraction unit 20. Differential interface signal components $I_2$ and $\bar{I}_2$ are applied to the two inputs 30', 32' of extraction unit 20'.

As discussed above, the impedance of extraction unit 20 is proportional to the first common mode data signal level CM1 carried by the first pair of differential signal components. Similarly, the impedance of extraction unit 20' is proportional to the second common mode data signal level CM2 carried by the second pair of differential signal component. The circuit functions as a type of differential amplifier, where the magnitude of current flow through each of the circuit legs is dependent on the relative impedances of the extraction units 20, 20', and therefore, is dependent on the applied common mode signals. The current through a single leg, i.e., the voltage drop across resistance 22 or 22' at node 34 or 34', or the voltage difference between nodes 34 and 34', indicates the data transmitted by differentially varying the two common mode signals embedded in the signals $I_1, \bar{I}_1$, and $I_2, \bar{I}_2$, respectively. As will be recognized by those of skill in the art, for a three wire system containing a common mode signal on two wires and a third wire containing the complementary signal, the inputs for 30' can both be wired and driven by the third wire to extract the common mode signal.

A preferred MOS implementation of the circuit of FIG. 3a is illustrated in FIG. 3b. The common mode extraction units 20, 20', and the resistances 22, 22' are implemented in the same manner as in the circuit of FIG. 1b. The current source 24 is comprised of two transistors 26, 26' connected in parallel so that the net current flow is the sum of the current sourced by each transistor 26, 26'. Although each transistor could be biased by a remotely generated biasing signal, preferably the current source is arranged in a self-biasing configuration using self-biasing paths 25, 25' as shown. Transistor 26 is driven by self-biasing path 25 which ties the gate to the voltage at node 34, i.e., the $\bar{D}$ output. Transistor 26' is driven by self-biasing path 25' which ties the gate to the voltage at node 34', i.e., the D output. Because $\bar{D}$ and D are complimentary output signals, when the magnitude of $\bar{D}$ increases, that of D decreases, and visa versa. As a result, the variations in the currents sourced by transistors 26, 26' cancel each other out and the net current flow provided by both transistors remains substantially constant.

In the new method of data transmission, a common mode data signal can also be carried by a plurality of differential signal pairs. For example, a first differential pair $I_1, \bar{I}_1$ can carry a first common mode data signal CM1 and a second differential pair 12, 12 can carry a second common mode data signal CM2, as discussed above. In addition, a third common mode data signal CM1–2 can be carried by varying the signal magnitude of all four signal component $I_1, \bar{I}_1, I_2, \bar{I}_2$ equally, so as to preserve the differential data.

In an alternative configuration, two extraction circuits, such as are shown in FIG. 1b, can be provided. Each extraction circuit receives one pair of differential inputs. The outputs of the two circuits comprises a pair of differential signal components, each of which comprises an extracted common mode signal level. The value of the common mode signal carried by the extracted common-mode carried differential signal components may then be determined by conventional means, such as by applying the extracted common mode pair to a standard differential amplifier.

Figure 4:
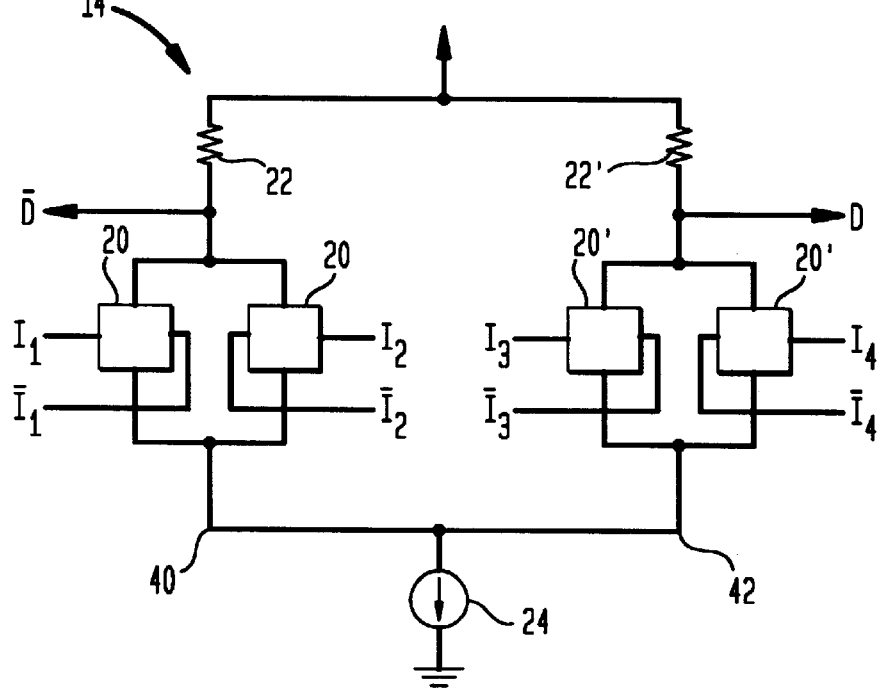
FIG. 4 is a circuit diagram of a common mode receiver according to a third embodiment of the invention.

Turning to FIG. 4, there is shown a circuit diagram of a common mode receiver 14 according to a third embodiment of the invention. Receiver 14 extracts common mode data signal CM 1–2 carried on two differential interface pairs $I_1$, $I_2$ as well as a second common mode data signal CM3–4 carried on two additional differential interface pairs 13, 14. The circuit is similar to that in FIG. 3, except that each current leg 40, 42 contains two extraction units 20 connected in parallel between the resistance 22 and the common current source 24. In this configuration, the current flow through leg 40 is proportional to the common mode level carried on the four applied differential signal components $I_1$, $\bar{I}_1$, $I_2$, $\bar{I}_2$ and is largely independent of differential variations among the differential signal components as well as possible differential variations in the common mode signal levels CM1 and CM2 carried by the differential signals, which variations would leave the combined common mode signal level CM1–2 substantially unchanged. (The differential data transmitted by variations in CM1 and CM2 can be extracted by use of the circuit of FIG. 3). It should be noted that while the circuit 14 of FIG. 4 is shown having two extraction circuits 20 on each leg, each comprising two parallel transistors, each leg of the circuit 14 may alternatively be considered as having a single extraction circuit 20 comprising four transistors arranged in parallel.

When two or more extraction units 20 are used in conjunction with one another, such as shown in FIGS. 3 and 4, preferably, each unit 20 is configured to have the same net current carrying capacity. Preferably, this is accomplished using input transistors having equal lengths and having widths such that the sum of the widths of the input transistors in each common mode extraction unit 20 (i.e., transistors 36, 38 in the circuit of FIG. 1b) are substantially equal, even if the extraction units 20 include different numbers of parallel transistors. This arrangement allows direct comparison of the output signals from the different extraction units. For example, the total input transistor width in the circuit of FIG. 1b is twenty. If this circuit were to be used in conjunction with an extraction unit 20' configured to process four inputs, and so having four input transistors, each input transistor in unit 20' would have a width of substantially five, providing a net width of twenty. Thus, the average current carried by different extraction circuits will be similar, even if the units process different number of inputs using different numbers of transistors. Similarly, if an extraction unit 20" for use with the circuit of FIG. 1b were provided to process only a single input with a single "extraction" transistor, the transistor should have a relative width of substantially twenty. This criteria assumes that the lengths of the input transistors in each extraction unit are equal. If different lengths are provided, the relative widths will have to be adjusted accordingly, in a manner known to those of skill in the art, to provide for comparable outputs.

Those of skill in the art will appreciate that common mode extraction circuits according to the invention may be used at the termination point of the interface by using suitable connections to the terminating resistance. However, because the voltages generated by the terminating resistances are generally carried across the entire length of the interface, circuits as disclosed herein, or appropriate modifications thereof, may be used to monitor the common mode signals at intermediate points on the interface as well, for example, as part of a bused data interface arrangement. Each receiving unit connected to the interface can monitor the common mode data signals without affecting the signal levels because the extraction units 20 draw little or no DC current (depending on the type of devices used) and only a minimal amount of AC current during signal transitions (due to the input capacitance). The transmitted common mode data may include, for example, control signals for communicating with and controlling devices associated with the connected receivers.

While the invention has been particularly shown and described with reference to preferred embodiments thereof, it will be understood by those skilled in the art that various changes in form and details may be made therein without departing from the spirit and scope of the invention. For example, while the invention has been discussed with regard to MOS transistors, other technologies, such as BJT and GaAs transistors may be used instead, as will be apparent to one skilled in the art.

I claim:

1. A circuit for extracting a common mode data signal carried by a plurality of component signals comprising:

one or more common mode extraction units connected between a first node and one or more second nodes, each of the common mode extraction units comprising one or more transistors connected between said first node and the respective second node to which that extraction unit is connected, wherein the transistors for an extraction unit comprising more than one transistor are connected in parallel, each of said component signals being provided as an input to at least one respective transistor, the net impedance of said transistors being a function of the magnitude of the common mode data signal; and a current driver connected between said first node and a reference voltage comprising:
   first and second transistors connected in parallel, said first transistor being driven by a first biasing signal and said second transistor being driven by a second biasing signal, wherein said first and said second biasing signals are complementary to one another.

2. The circuit of claim 1, wherein transistors in a given common mode extraction unit have substantially the same operating characteristics.

3. The circuit of claim 1, wherein said component signals comprise at least one pair of differential signal components.

4. A circuit for extracting a differential data signal defined by the difference between a first common mode signal level carried by a first component signal and a second component signal and a second common mode signal level carried by a third component signal, said circuit comprising:

a first common mode extraction unit connected between a first node and a second node;

a single transistor connected between the first node and a third node;

a first resistance connected between said second node and a fourth node;

a current driver connected to said first node comprising:
   first and second transistors connected in parallel, said first transistor being driven by a voltage at said second node, said second transistor being driven by a voltage at said third node; and
   a second resistance connected between said third node and said fourth node;

said first common mode extraction unit receiving said first component signal and said second component signal as inputs and drawing a current dependent on the magnitude of the first common mode signal level;

said single transistor receiving said third component signal as input and drawing a current dependent on the magnitude of the second common mode signal level;

the magnitude of current flow through one of said first extraction unit and the single transistor indicating the value of the differential data signal.

5. The circuit of claim 4, wherein said first common mode extraction unit comprises a plurality of transistors connected in parallel, each of said first component signal and second component signal being connected to at least one transistor in said first common mode extraction unit.

6. The circuit of claim 5, wherein the sum of the widths of each of said transistors in said first common mode extraction unit is substantially equal to the width of said single transistor.

7. The circuit of claim 5, wherein:
said first common mode extraction unit comprises two transistors connected in parallel;
said first and said second component signals comprise a first pair of differential signal components; and
said third component signal comprises a second pair of differential signal components.

8. The circuit of claim 5, wherein:
said first common mode extraction unit comprises four transistors connected in parallel;
said first and said second component signals comprise first and second pairs of differential signal components; and
said third component signal comprises a third pair of differential signal components.

9. A method for extracting a common mode data signal carried by a plurality of component signals, said method making use of a common mode extraction unit including a plurality of transistors connected in parallel between first and second nodes and a current driver connected between said first node and a reference voltage, said current driver comprising first and second transistors connected in parallel, wherein said first and said second transistors are driven, respectively, by complementary first and second biasing signals, said method comprising the steps of:
applying each one of said plurality of component signals to a corresponding one of said plurality of transistors; and
measuring the net impedance of said plurality of transistors.

10. A method for extracting a data signal defined by the difference between a first common mode signal level carried by a first set of a plurality of component signals and a second common mode signal level carried by a second set of a plurality of component signals, said method making use of a first common mode extraction unit including a first set of at least three transistors connected in parallel between first and second nodes and a second common mode extraction unit including a second plurality of transistors connected in parallel between said first and a third node said method comprising the steps of:
applying each one of said plurality of component signals in said first set to a corresponding one of said transistors in said first common mode extraction unit;
applying each one of said plurality of component signals in said second set to a corresponding one of said transistors in said second common mode extraction unit;
supplying an operating current to each of said first and second common mode extraction units, such that the net current flow through said first and second common mode extraction units is substantially constant;
determining the magnitude of the current flow through at least one of said first and second common mode extraction units, the determined current magnitude indicating the magnitude of the data signal.

11. A method for extracting a common mode data signal carried by a plurality of component signals, said method making use of a common mode extraction unit including at least three transistors connected in parallel between first and second nodes and a current driver connected between said first node and a reference voltage, said current driver comprising first and second transistors connected in parallel, wherein said first and said second transistors are driven, respectively, by complementary first and second biasing signals, said method comprising the steps of:
applying each one of said plurality of component signals to a corresponding one of said at least three transistors; and
measuring the net impedance of said at least three transistors, to extract said common mode data signal.

12. A method for extracting a data signal defined by the difference between a first common mode signal level carried by a first set of a plurality of component signals and a second common mode signal level carried by another component signal, said method making use of a first common mode extraction unit including a first plurality of transistors connected in parallel between first and second nodes and a second common mode extraction unit including a single transistor connected between said first and a third node, said method comprising the steps of
applying each one of said plurality of component signals in said first set to a corresponding one of said transistors in said first common mode extraction unit;
applying said another component signal the single transistor in said second common mode extraction unit;
supplying an operating current to each of said first and second common mode extraction units, such that the net current flow through said first and second common mode extraction units is substantially constant;
determining the magnitude of current flow through at least one of said first and second common mode extraction unit, the determined current magnitude indicating the magnitude of the data signal.

* * * * *